United States Patent [19]

Grabarz et al.

[11] Patent Number: 5,302,266
[45] Date of Patent: Apr. 12, 1994

[54] METHOD AND APPARATUS FOR FILING HIGH ASPECT PATTERNS WITH METAL

[75] Inventors: Henry J. Grabarz, Huntington, Conn.; Alfred Grill, White Plains, N.Y.; William M. Holber, New York, N.Y.; Joseph S. Logan, Poughkeepsie, N.Y.; James T. C. Yeh, Katonah, N.Y.

[73] Assignee: International Business Machines Corporation, Armonk, N.Y.

[21] Appl. No.: 951,924

[22] Filed: Sep. 25, 1992

Related U.S. Application Data

[63] Continuation-in-part of Ser. No. 854,187, Mar. 20, 1992, abandoned.

[51] Int. Cl.5 .............................................. C23C 14/34
[52] U.S. Cl. ........................ 204/192.12; 204/298.16; 118/723; 427/523; 427/575; 427/598
[58] Field of Search ............... 204/192.31, 298.05, 204/192.12; 427/523, 575, 595, 598, 531; 118/723

[56] References Cited

U.S. PATENT DOCUMENTS

| | | | |
|---|---|---|---|
| 4,420,386 | 12/1983 | White | 204/192 N |
| 4,721,553 | 1/1988 | Saito et al. | 204/192.12 |
| 4,874,497 | 10/1989 | Matsuoka et al. | 204/298 |
| 4,911,814 | 3/1990 | Matsuoka et al. | 204/298 |
| 4,915,806 | 4/1990 | Lardon et al. | 204/192.31 |
| 4,925,542 | 5/1990 | Kidd | 204/192.31 |
| 4,944,961 | 7/1990 | Lu et al. | 427/38 |
| 4,952,273 | 9/1990 | Popov | 156/643 |
| 4,990,229 | 2/1991 | Campbell et al. | 204/298.16 X |
| 5,006,219 | 4/1991 | Latz et al. | 204/298.16 |
| 5,087,478 | 2/1992 | Williamson | 204/298.05 X |
| 5,110,435 | 5/1992 | Haberland | 204/298.05 X |

FOREIGN PATENT DOCUMENTS

| | | |
|---|---|---|
| 6400027 | 1/1989 | Japan . |
| 1-297141 | 11/1989 | Japan . |
| 293060 | 4/1990 | Japan . |

OTHER PUBLICATIONS

Mei et al., Abstract Avs 34th Nat'l Symp., 1987.
Kidd et al., "Research" Abstract (date after 1985).
Dawson et al., Phys. Rev. Ltrs., 1976.
J. Vac. Sci. Technol A., vol. 9, No. 3, "A Magnetically . . . Modification Use," Kidd, May/Jun. 1991, pp. 466–473.
Int. Conf. on Metallurgical Coatings, Mar. 23–27, 1987 (TRW) in San Diego, Calif. by Kidd et al., "A Large Volume . . . Modification Research", 20-page handout.
J. Vac. Sci. Tech. A 8(5), Sep./Oct. 1990, pp. 3720–2735 by W. M. Holber, "Ion Energetics in Electron Cyclotron . . . Discharges".
Shinobu Takehiro, "Norimasa Yamanaka Horuo Shindo, Shoso Shigubara and Yasuhiro Horiike, Sputtering of aluminium Film using Microwave Plasma with High Magnetic Field", Japanese Journal of applied Physics, pp. 3657-3661; vol. 30, No. 128.

Primary Examiner—Nam Nguyen
Attorney, Agent, or Firm—Ratner & Prestia

[57] ABSTRACT

An electron cyclotron resonance plasma heating apparatus system and process in which microwave energy is transmitted directly in an axial direction through an evacuated chamber to generate energetic electrons. These energetic electrons spiral around the magnetic field lines formed by the solenoid and spiral substantially parallel to the axis. A metal atom vapor source transmits the metal atom vapor into the chamber through a housing port in the chamber wall. The metal atom vapor source in the housing is out of the line of sight of the substrate. The metal atoms are ionized by the energized electrons, and these ionized metal atoms are confined to the plasma column substantially free of neutral atoms as such ionized metal approaches and contacts the substrate in said evacuated chamber. In this way, the ionized metal atoms substantially avoid contact with the wall of chamber. A sputter target of a second metal may be placed in the plane of the substrate and a bias voltage applied to the target. Atoms of the second metal are then sputtered off and ionized by the plasma and are deposited on the substrate with the first metal ions.

24 Claims, 10 Drawing Sheets

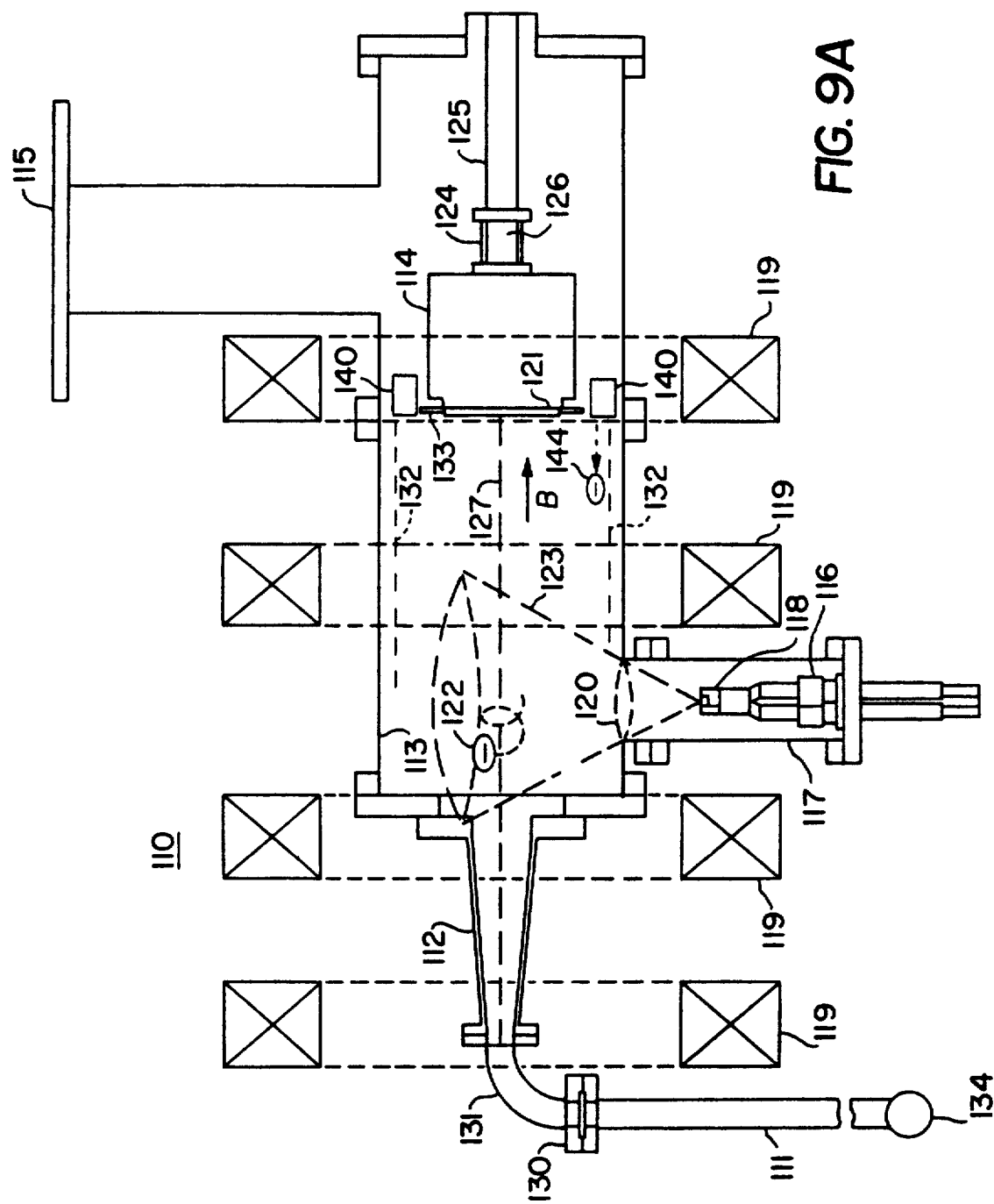

METHOD AND APPARATUS FOR FILING HIGH ASPECT PATTERNS WITH METAL

This application is a continuation-in-part of application Ser. No. 07/854,187, filed Mar. 20, 1992, abandoned.

This invention relates to a method and apparatus for metal plating of semiconductor substrates that incorporate microelectronic circuitry. More particularly, this invention provides a method and apparatus for filling previously formed high aspect ratio passages or holes in a semiconductor substrate by using electron cyclotron resonance (ECR) heated plasma.

BACKGROUND OF THE INVENTION

Conventional methods such as evaporation, magnetron sputtering, and ion plating have been used for depositing metal films over integrated circuit wafers (usually made of silicon or doped silicon) for forming metal conductor patterns on top of underlying insulator films as well as between one layer of wiring and another. The films in the past have been patterned by either liftoff methods or subtractive etch methods. As the densities of metal wiring patterns have increased, the need to obtain vertical profiles on both wiring patterns as well as via patterns has emerged. One of the ways to produce such metal patterns is to pre-etch a vertical interconnecting (via) pattern or a metal wiring pattern in the underlying insulator film, followed by metal film deposition, followed by a selective removal process such as mechanical polishing, which takes metal off the high spots, leaving metal in the etched pattern ("Damascene" process).

One problem with this method is that it is difficult to deposit void-free metal films when the aspect ratio (depth to width ratio) of the pattern approaches or exceeds 1.0. In order to accomplish this, there has been a requirement for highly directional deposition of the metal (normal, that is perpendicular, to the substrate plane). Evaporation can produce a metal vapor stream which is nearly collimated, but which normally has enough divergence to produce voiding by a slight shadowing at the edges. This voiding gets worse at points on a planar substrate which are away from the principal axis of the evaporator point (which is usually normal to a line from the source). Minimizing this deviation requires very large throw distances, with a corresponding decrease in deposition rate. Sputtering sources, such as magnetrons, produce a highly diffuse source of vapor which cannot coat the bottom of the pattern at a rate comparable to the top and sidewalls, so the deposit pinches off the opening.

U.S. Pat. No. 4,915,806 to Lardon, et al. illustrates how evaporation techniques may be combined with sputtering to fill high aspect ratio microcavities. An electron beam, magnetically deflected into a vaporizer crucible, provides the particle source for a particle beam. The metal particle beam source width and throw distance are selected so that the source subtends an angle of less than ten degrees when viewed from any microcavity to be filled. To prevent scattering of the beam, the process is performed under vacuum and the mean free path of the particles in the beam is maintained at a minimum of one third of the distance from source to substrate. Following initial vapor deposition, Argon gas is introduced to the chamber, and a voltage potential is established between the substrate and the chamber, causing partial sputtering to redistribute the deposited metal more evenly within the microcavity, reducing voids.

U.S. Pat. No. 4,925,542 to Kidd discusses a plasma type metal plating apparatus which increases the longitudinal velocity of moving plasma ions within a chamber in the region of the substrate, prior to incidence of those ions on the substrate. The metal ions travel in a spiral path towards the substrate, with velocity components parallel to and normal to the direction of the magnetic field. Kidd selectively enhances the longitudinal velocity component, providing a more collimated metal source than previous sputtering techniques.

Kidd uses the electron cyclotron resonance technique to generate the plasma. The metal source is located within the chamber opposite the substrate. A magnetic field is established within the chamber, and a microwave energy source is provided. The magnetic field strength and electron frequency are related by equation (1) as follows:

$$f = (e)(B)/[(2\pi)(m)] \tag{1}$$

where:
 $f$ = electron frequency
 $B$ = magnetic field strength in Tesla
 $e$ = electron charge
 $m$ = electron mass When the frequency of the electromagnetic energy is equal to the frequency of the electrons (resonance), then the resonant radiant energy heats the electrons. These heated electrons in turn furnish the energy to ionize the atoms of metal in the chamber, generating the plasma. The resonance zone in Kidd is located very close to the metal source.

Kidd also discusses a grounding screen interposed between the sputter source and the substrate. The grounding screen allows the substrate voltage to be increased without impacting plasma voltage, so that an electric field is established between the screen and the substrate. This electric field permits addition of energy to the plasma ions, providing the desired increase in longitudinal velocity.

Other methods such as Chemical Vapor Deposition (CVD) or Plasma Enhanced Chemical Vapor Deposition (PECVD) require higher substrate temperatures to obtain reasonable rates and low resistivities, which may be incompatible with organic insulator materials, or may be economically unattractive as a manufacturing process.

SUMMARY OF THE INVENTION

A method and apparatus for filling passages formed in a semiconductor substrate using a metal plating apparatus of the electron cyclotron resonance plasma heating type. The apparatus has a chamber surrounded by a solenoid with an axis. The solenoid creates a magnetic, field which is substantially parallel to the axis. Metal atoms are vapor is transmitted into the chamber from a metal atom source which does not have a direct line of sight to the substrate. Microwave energy is transmitted in the axial direction to generate energetic electrons which spiral around the magnetic field lines. The electrons ionize the metal atoms, forming a plasma. The ionized metal atoms are substantially confined to the plasma, which is substantially free of neutral metal atoms in the vicinity of the substrate. A bias voltage directs the plasma in the axial direction along the magnetic field lines of the solenoid and through an evacuated chamber towards the substrate. The exemplary metal atom source is a metal vapor source with no direct line of sight to the substrate.

A second metal atom source may be added in order to deposit an alloy on the substrate. For example, a sputter target of a second metal may be placed in the plane of the substrate and a bias voltage applied to the target. Atoms of the second metal are sputtered off and ionized by the plasma and are deposited on the substrate with the first metal ions.

BRIEF DESCRIPTION OF THE DRAWINGS

FIGS. 9a and 9b show a fourth embodiment of the invention.

DETAILED DESCRIPTION OF THE EXEMPLARY EMBODIMENT

The following is an example of an exemplary method and electron cyclotron resonance plasma heating apparatus in accordance with the present invention.

STRUCTURE

Figure 1:
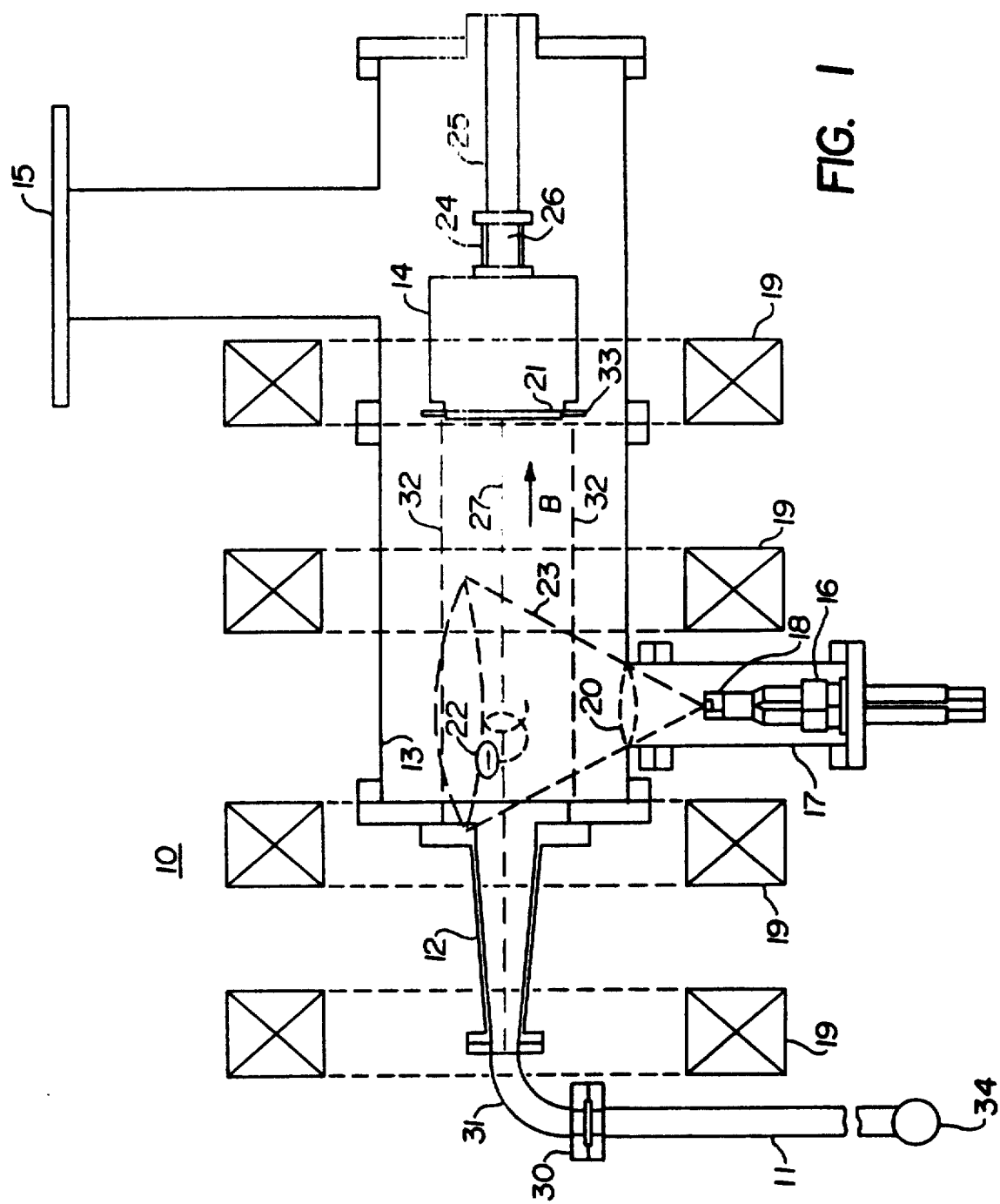
FIG. 1 is a diagram of an exemplary electron cyclotron resonance plasma heating apparatus in accordance with the present invention.

FIG. 1 shows a cross section of the electron cyclotron resonance plasma heating apparatus 10. The main structure within the apparatus 10 is a cylindrical vacuum chamber 13. The vacuum chamber 13 is formed of ultra high vacuum stainless steel, capable of sustaining pressures of $2 \times 10^{-7}$ millimeters of mercury or less. Vacuum chamber 13 includes an exhaust port 15, through which gas is evacuated. Closure members that allow access to the chamber and other common elements all of which accompany a practical structure, are known and are necessarily included, but are not separately illustrated. These members and their use are familiar to practitioners in this field.

Microwave energy is introduced into the vacuum chamber 13 through a microwave energy waveguide horn 12 at one end of the chamber. A microwave waveguide bend 31 is connected to waveguide horn 12. A quartz vacuum window 30 is connected to waveguide bend 31. The vacuum chamber 13, waveguide horn 12, waveguide bend 31 and quartz vacuum window 30 form a sealed cavity maintained at vacuum pressure. On the side of the quartz vacuum window 30 which is exposed to atmospheric pressure, microwave waveguide 11 provides a path between quartz vacuum window 30 and the microwave energy source 34, which may be a klystron oscillator. In the exemplary embodiment, microwave energy source 34 operates at 2.45 Gigahertz (GHz). The waveguide 11, quartz vacuum window 30 and the waveguide bend 31 are all conventional rectangular components. Horn 12 is a rectangular to circular transition. It is understood by those skilled in the art that other waveguide cross sections may be employed.

A substrate support tube 25 is fixed to the end of the chamber 13 opposite the microwave energy waveguide horn 12. At the end of the support tube 25, a DC voltage source 24, DC voltage control 26 and substrate holder 14 are provided. DC voltage source 24 provides a bias voltage for the substrate 21, which bias voltage may be adjusted by DC voltage control 26. The substrate support tube 25 includes water coolant tubes and conventional DC wires (not shown) for the substrate 21 bias voltage and for the substrate holder 14.

Substrate holder 14 holds a substrate 21 in place for processing. Substrate holder 14 may be an electrostatic chuck to which substrate 21 is attached. An electrostatic charge on the substrate holder 14 clamps the substrate to the chuck without mechanical fasteners. A conductive ring 33 includes a circumferential row of flexible contacts which bear on the substrate surface. The microwave waveguide bend 31 eliminates any direct line of sight between the microwave energy source 34 and substrate 21.

In the exemplary embodiment, substrate 21 is a 125 millimeter diameter silicon wafer. Typically, the silicon has a complex insulating film on it, containing etched patterns into which the metal is to be deposited, and later selectively removed. The contacts in the substrate holder 14 maintain a connection to the growing metal film during processing.

An alternative method to provide the bias voltage is to use an appropriate RF voltage source. An RF voltage source does not need to maintain a DC contact to the metal film on the substrate 21.

A housing 17 extends from the perimeter of vacuum chamber 13, and is disposed close to the end of the chamber adjacent waveguide horn 12. Housing 17 joins vacuum chamber 13 at a port 20. The walls of housing 17 are formed of the same ultra high vacuum stainless steel material as vacuum chamber 13. Housing 17 is sealed to maintain the vacuum in vacuum chamber 13. A conventional metal evaporator 16 is disposed at the end of housing 17, remote from port 20. Metal evaporator 16 may use one of several previously known methods to heat metal, including a heated filament, an electron gun, or RF induction. In the exemplary embodiment, the metal evaporator 16 is a heated filament. Metal evaporator 16 has a port into the vacuum chamber 13 which forms a metal vapor source 18, through which metal atom vapor is introduced. This vapor flow is shown in FIG. 1 by the conical metal atom vapor plume 23. The solid angle subtended by metal atom vapor plume 23 is determined by the diameter of the port 20 and the shortest (perpendicular) distance between metal vapor source 18 and port 20. The solid angle defines the aspect ratio of conical plume 23, i.e., the greater the solid angle, the greater the ratio between the diameter of port 20 and the distance between the metal vapor source 18 and the port.

The respective dimensions of vacuum chamber 13 and housing 17 are selected so that the substrate 21 lies outside the solid angle subtended by the metal atom vapor plume 23. In FIG. 1, plume 23 is shown terminating near the center of the chamber, where the plasma is formed. A small fraction of the metal, vapor atoms outside plume 23 (not shown) are not ionized. Neutral atoms are transmitted within plume 23 (within this solid angle) to the wall of chamber 13. These neutral atoms, which are directed by the metal vapor source and housing 17, do not impinge on the substrate. In other words, there is no direct line of sight between the metal vapor source 18 and the substrate 21

In this exemplary embodiment, the housing 17 is cylindrical in shape with a circular port 20. Housing 17 may be of various shapes, so long as the line of sight constraint is met. Any suitable cross section (e.g., rectangular) for the housing 17 may be selected to facilitate installation of metal evaporator 16.

The vacuum in chamber 13 minimizes random collisions between the metal atom vapor and gas in the chamber, thus minimizing dispersion of the neutral metal atoms outside of the plume 23. In this manner, the present invention prevents the neutral metal vapor atoms from impinging on the substrate 21.

Vacuum chamber 13 and the waveguide horn 12 are surrounded by a set of solenoids (magnetic coils) 19. The solenoids 19 are controlled separately from one another to vary the magnetic field intensity along the direction of a vacuum chamber longitudinal axis 27. The magnetic field intensity exceeds the intensity required for resonance (875 Gauss in the exemplary embodiment) over most of the length of the apparatus, from the quartz vacuum window 30 to a location near the substrate 21. The intensity of the magnetic field falls off below the resonance value past the substrate 21.

OPERATION

As explained below, the present invention provides high quality hole filling capability with aspect ratios up to two, and only slight porosity with aspect ratios as high as four.

Substrate 21 is mounted on substrate holder 14. A quantity of the metal to be deposited on substrate 21 is inserted in the metal evaporator 16. All of the components of the apparatus 10 are assembled and sealed and the air is evacuated from the vacuum chamber 13 through exhaust port 15. The pressure within the vacuum chamber is reduced to $2 \times 10^{-7}$ mm of mercury at this point in the procedure. This low pressure is selected before beginning metallization, because it is anticipated that subsequent outgassing will raise the pressure from this starting value to as high as $5 \times 10^{-6}$ mm. Low pressure is critical to reduce random collisions which tend to reduce the angle of incidence of the ions impinging on the substrate 21.

The metal evaporator 16 is heated to provide a steady flux of metal atoms into the vacuum chamber 13 with sufficient density to support the desired metal deposition rate. In the exemplary embodiment, the metal used is copper, the evaporation rate is between one and two grams per minute, and the vapor is introduced into chamber 13 in a direction substantially perpendicular to the axis 27 of solenoid 19. The initial temperature of the vapor atoms corresponds to less than 0.2 electron volts (eV).

Figure 2:
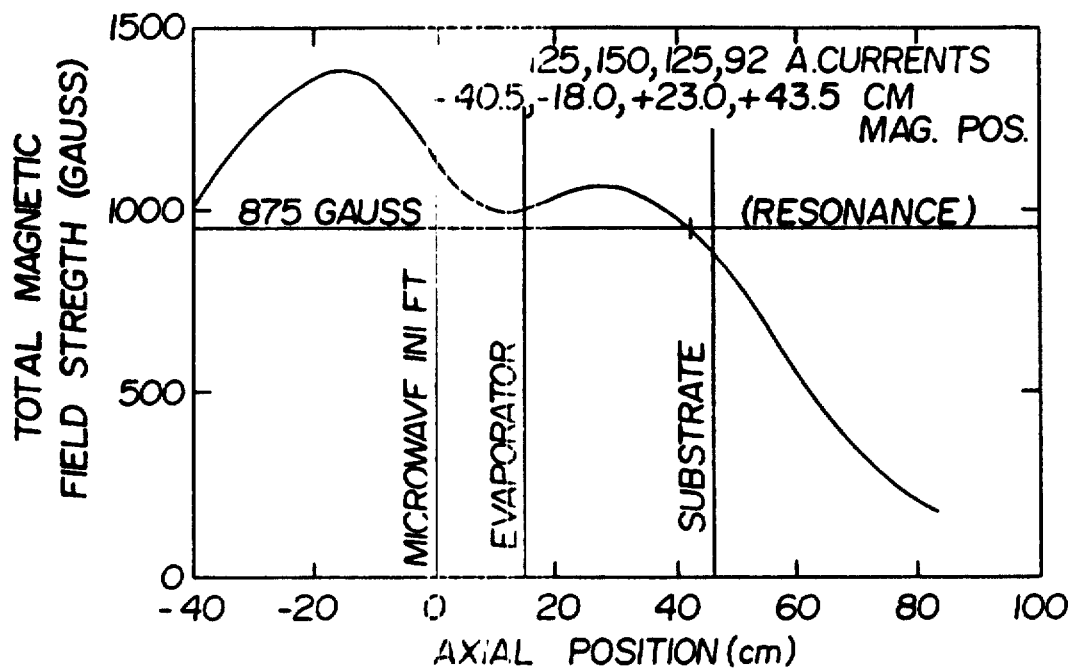
FIG. 2 shows the profile of the magnetic field intensity along the longitudinal axis of the apparatus shown in FIG. 1.

Once the metal atom vapor plume 23 has reached the desired rate, magnetic field (B) is established, followed by the introduction of the microwave power. The magnetic field is substantially symmetrical about longitudinal axis 27. FIG. 2 shows the variation in the magnetic field intensity, along a magnetic field line beginning at a radius of 1 centimeter from axis 27, as a function of the axial position. Field intensity profiles are not shown for other radii; the profiles are similar to that shown in FIG. 2. In the exemplary embodiment, the microwave energy source 34 operates at 2.45 GHz. From equation (1), a magnetic field of 875 gauss will energize electrons to a frequency of 2.45 GHz, the resonance frequency.

The magnetic field profile used in the exemplary embodiment provides advantageous results. In the present invention, the field intensity is set above the resonance value at most displacements from the quartz vacuum window 30 to an axial position just in front of the substrate 21 As shown in FIG. 2, the field intensity is greatest at the displacements corresponding to the location of the waveguide horn 12. By keeping the field intensity far from the resonance value, localized absorption of microwave energy in the waveguide horn 12 region is avoided.

A localized resonance zone of 875 gauss (not shown in FIG. 2) is located above the metal vapor source 18, at a radius of 12 to 15 centimeters from the axis 27. This resonance zone helps to ionize the metal atoms in plume 23, before they reach the vacuum chamber 13 walls. Within the resonance zone, the microwave energy emanating from the waveguide horn 12 is highly absorbed by the electrons 22 in the chamber. This energizes the electrons, which spiral around the magnetic field lines substantially parallel to the axis 27. The energized electrons 22 can ionize neutral metal atoms with which they collide, creating the desired plasma. The plasma comprises positive copper ions and free electrons 22, which travel about the axis 27. The plasma is substantially free of neutral metal atoms near the substrate and is substantially confined by the magnetic field to the main plasma column 32, a cylindrical region concentric with the walls of vacuum chamber 13. In order to deposit copper on the substrate 21, it is desirable to accelerate the copper ions toward the substrate. This objective is met by introducing a negative bias voltage to the substrate 21 from the DC voltage source 24.

The use of the magnetic field intensity profile shown in FIG. 2, with two resonance zones, produces a high metal ion current at the substrate 21. The metal ion current primarily comprises positive metal ions which spiral around the magnetic field lines with a high velocity component in the direction parallel to the axis 27. In the exemplary embodiment, metal ion currents of 3 Amperes, or 9 milliamperes per square centimeter are obtained at a microwave power of 1500 watts and a substrate 21 bias voltage of $-50$ volts. This ion current produced metal deposition rates as high as 4000 Angstroms per minute.

Because there is no line of sight between the metal vapor source 18 and substrate 21, neutral atoms are substantially prevented from reaching the substrate. The metal ion velocities are readily controlled by varying the substrate bias voltage, so that the present invention can deliver particles substantially normal to the substrate 21, or at different angles if desired. An advantageous use for this capability, well adapted for filling high aspect ratio holes, is for multi-staged deposition processes.

Figure 3:
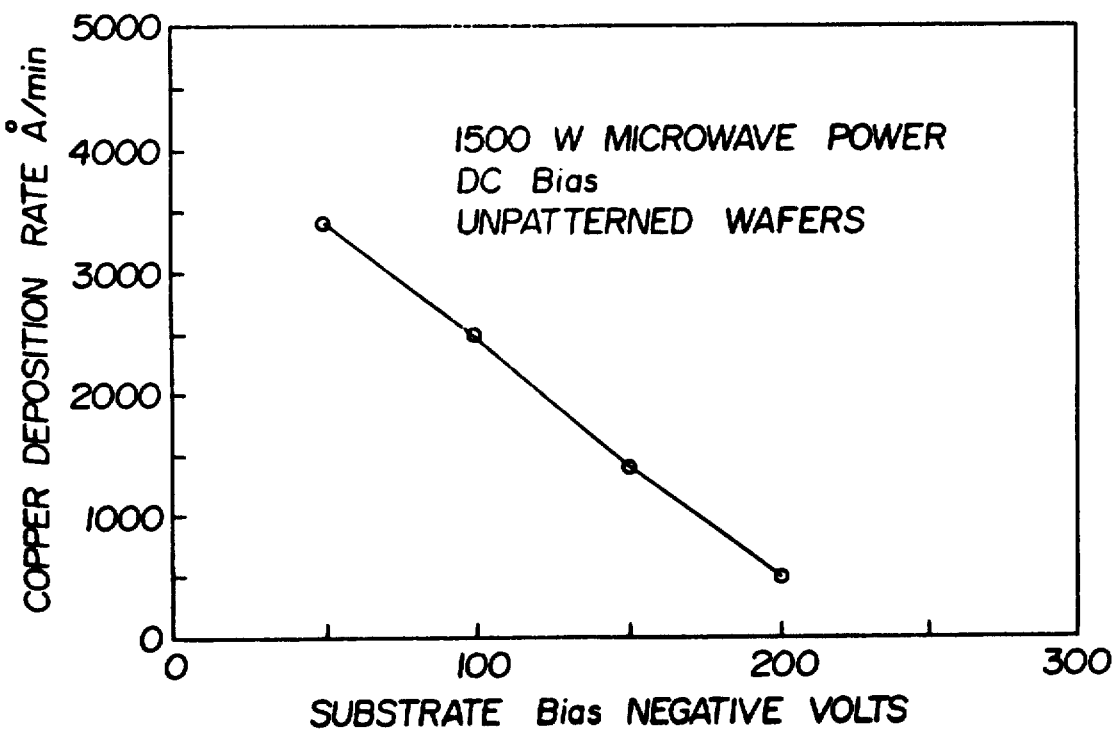
FIG. 3 is a graph showing variation in copper deposition rate as a function of the substrate bias voltage, for the apparatus shown in FIG. 1.

FIG. 3 shows how the copper deposition rate on unpatterned substrates varies as a function of the substrate 21 bias voltage. The deposition rate for unpatterned substrates falls off to near zero at about −230 volts. At the same time, significant deposition on the bottom of high aspect ratio holes is observed at high bias voltages. At lower bias voltages, greater deposition is observed in lower aspect ratio features. Another advantageous feature of the present invention is the ability to combine high and low bias deposition stages in the plating of a single substrate.

Figure 4C:
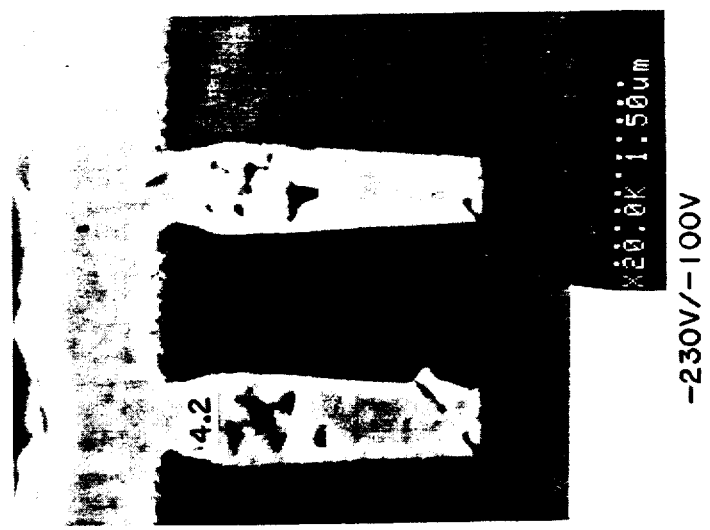
FIG. 4a, 4b and 4c are photo-micrographs showing cross sections of substrate passages which were filled with copper using the invention shown in FIG. 1.
Figure 4B:
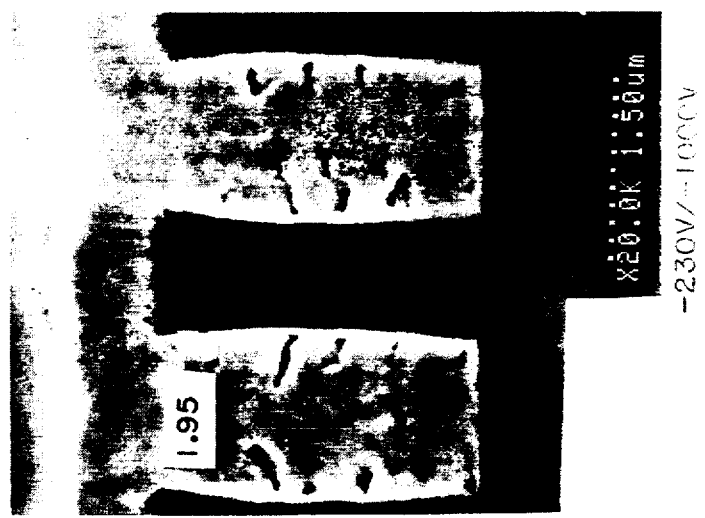
Figure 4A:
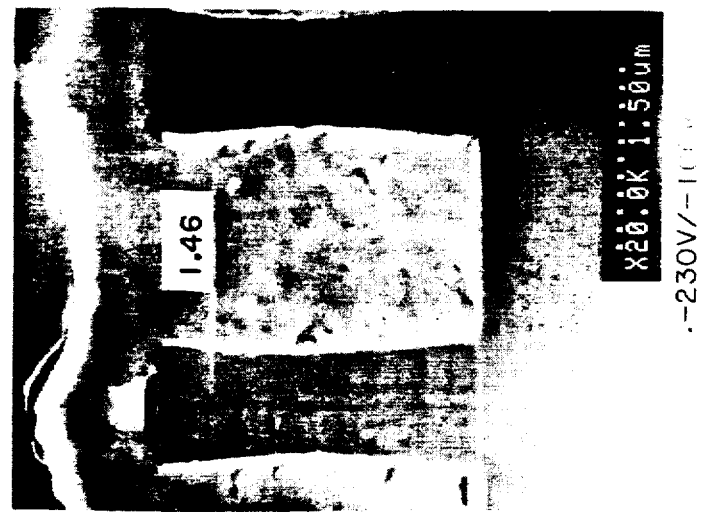

FIGS. 4a through 4c show the results of a two stage deposition process. The first part of the deposition process is done at high bias to fill the bottoms of the passages (holes). In addition, during this part of the process, the accelerated ions impinging on the substrate partially sputter-etch material at the top of the passages. This partial resputtering reduces lateral growth, preventing the holes from closing up as the metal film is deposited. The second part is done at lower bias (−100 volts) to complete the filling of lower aspect ratio features and the upper parts of the high aspect ratio features which are at that point reduced in actual aspect ratio by the filling of the bottoms of the passages. The conditions which are used for filling the structures shown in cross-section in FIGS. 4a–4c are 10 minutes at −230 volts bias followed by 7 minutes at 100 volts, all at constant microwave power of 1.5 KW. A metal ion current of 2.9 amperes is obtained at the substrate and substrate holder during the −230 volt period and 2.76 amperes during the −100 volt period. The cross-section of the FIG. 4 photo-micrographs show good filling at aspect ratios of 1.46 (FIG. 4a) and 1.95 (FIG. 4b), and only a slight porosity at an aspect ratio of 4.2 (FIG. 4c). These polished cross sections through the holes were lightly acid etched to reveal regions of low density or holes.

Figure 5:
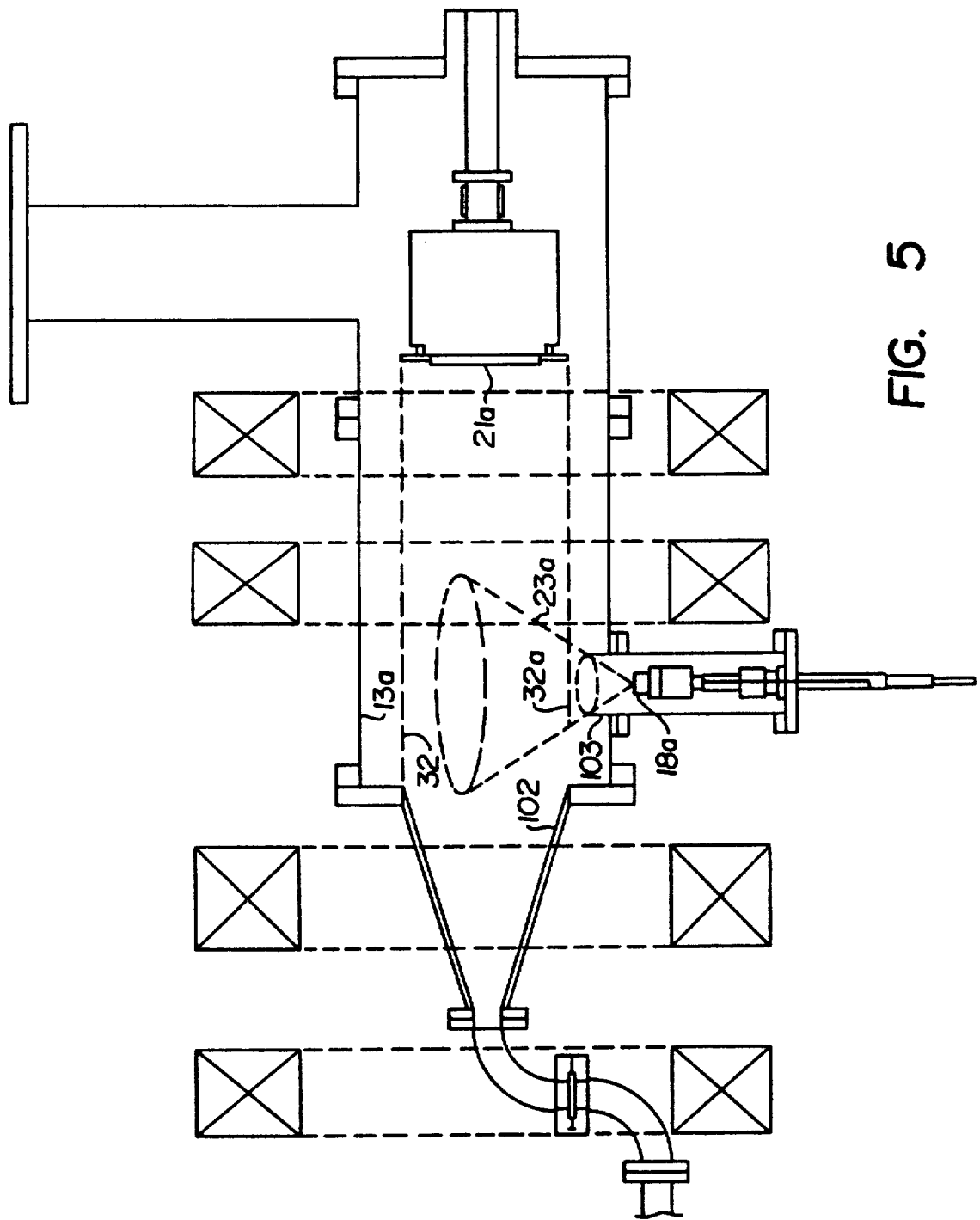
FIG. 5 illustrates a further exemplary electron cyclotron resonance plasma heating apparatus in accordance with the present invention.

FIG. 5 shows a second exemplary embodiment of the invention. The second embodiment differs from the first embodiment in the following ways. A baffle 103 extends into the vacuum chamber 13a to reduce the solid angle subtended by the metal atom vapor plume 23a. This baffle guides the atoms in the vapor plume 23a to the resonance region in which microwave energy is best absorbed, and provides a further method to eliminate the line of sight between the metal vapor source 18a and the substrate 21a. The baffle size is selected to ensure that the baffle does not obstruct the main plasma column 32a between the waveguide horn 102 and the substrate 21a.

Figure 6:
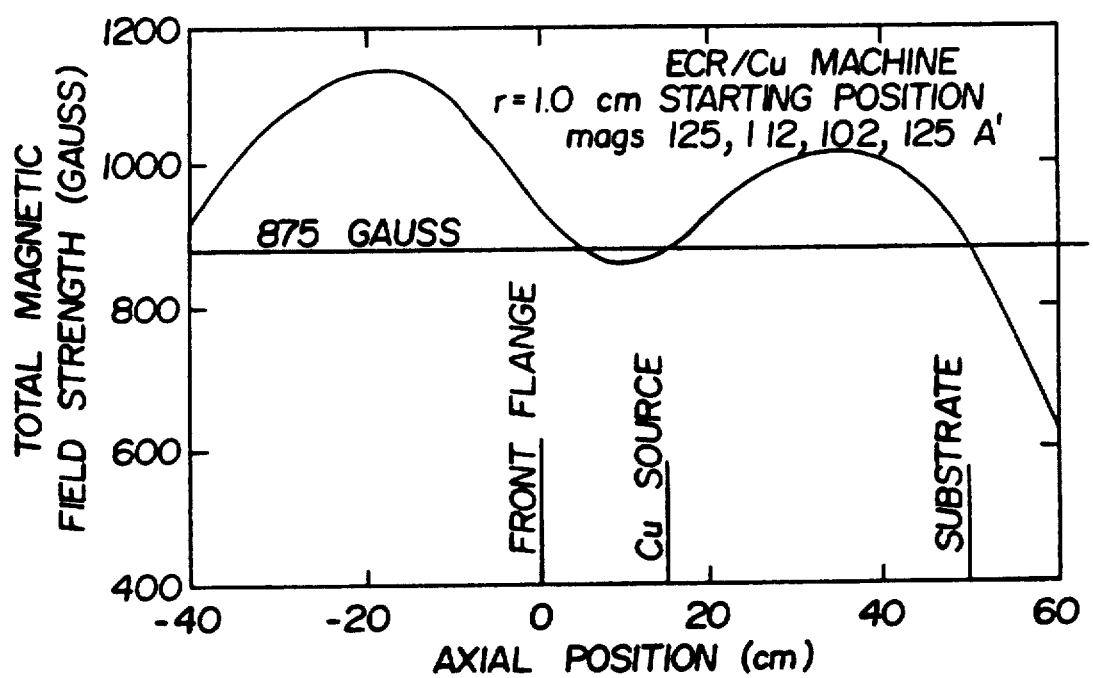
FIG. 6 is a graph showing the profile of the magnetic field intensity along the longitudinal axis of the apparatus used in the further embodiment shown in FIG. 5.

In the second exemplary embodiment, the microwave waveguide horn 102 is a rectangular-to-square transition. In order to accommodate the microwave energy field provided by the square waveguide horn 102 cross section, a magnetic field profile is used which differs slightly from that shown in FIG. 2. FIG. 6 is a graph which shows the magnetic field profile for operation of the apparatus of the second exemplary embodiment. This profile has been shown empirically to provide a more uniform metal deposition for the apparatus configuration shown in FIG. 5. While this profile differs slightly from the profile shown in FIG. 2, it employs the same general technique of maintaining the magnetic field intensity above resonance in the waveguide horn 102 and creating two resonance zones. One resonance zone is above the metal atom vapor plume 23a, and the second is near the substrate.

Figure 7A:
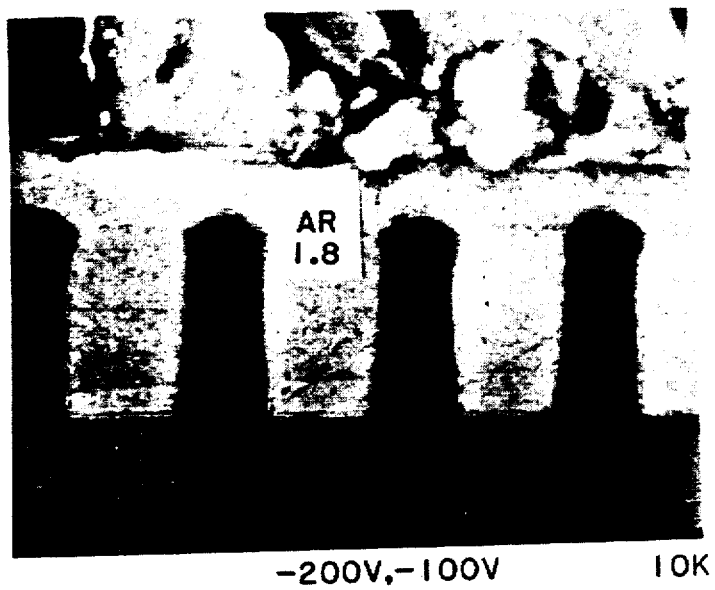
FIG. 7a, 7b and 7c are photo-micrographs of cross sections of substrate passages which were filled with copper using the further embodiment of the invention shown in FIG. 5.
Figure 7B:
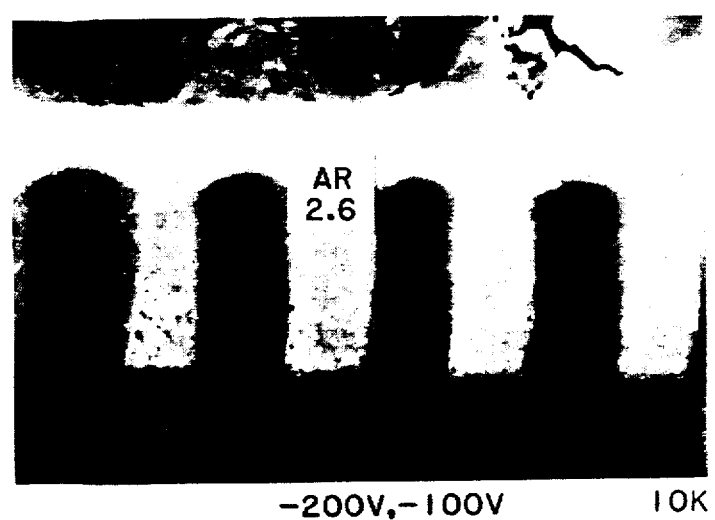
Figure 7C:
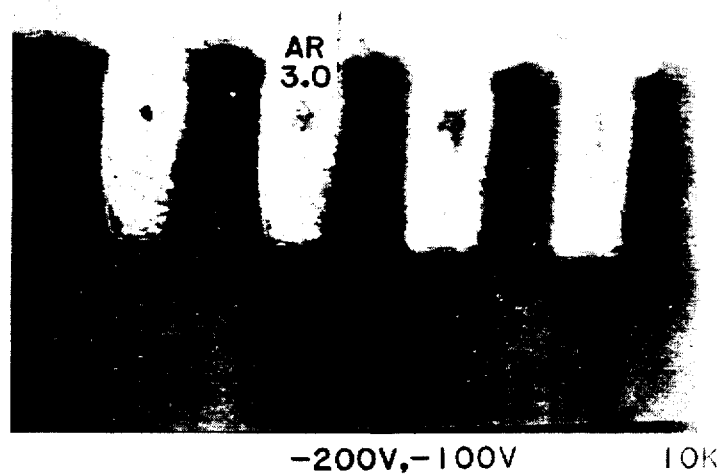

Deposition of copper using the second exemplary embodiment of the apparatus is done at slightly lower substrate bias, but with equivalent copper evaporation rate and microwave power, in a 2-step manner as in the first exemplary embodiment. The first step is done at a DC bias of −200 volts for 22 minutes, followed by 8 minutes at 100 volts. The metal ionic current at the substrate and substrate holder is 1.24 amps. FIGS. 7a–7c show the cross-sectional views of holes filled by this process. Good filling is obtained for aspect ratios of 1.8 (FIG. 7a) and 2.6 (FIG. 7b), with a small void apparent at an aspect ratio of 3.0 (FIG. 7c). Higher aspect ratios had larger voids.

Figure 8:
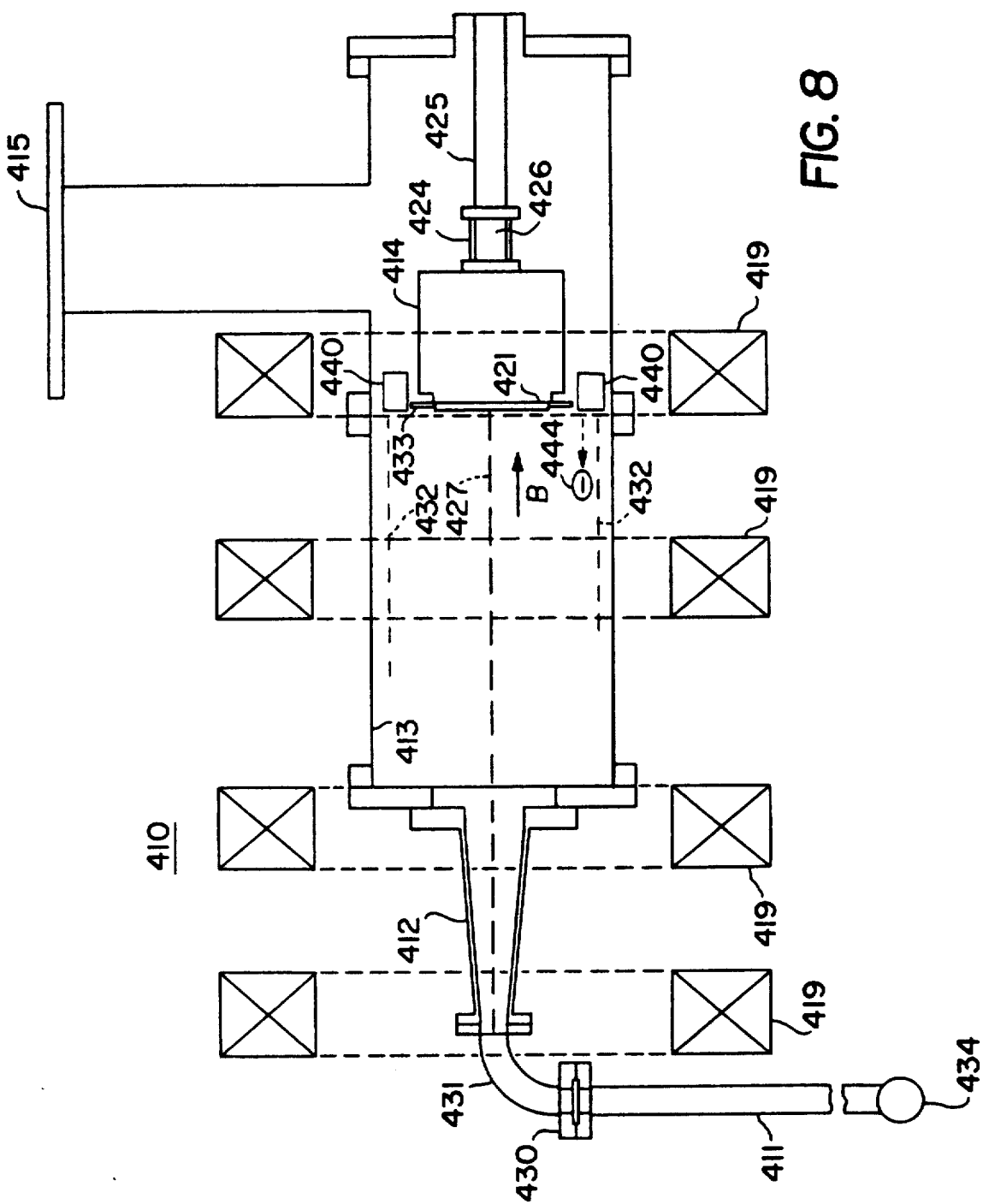
FIG. 8 shows a third embodiment of the invention.

FIG. 8 shows a third exemplary embodiment of the invention. The apparatus is similar to the apparatus shown in FIGS. 1 and 2, except that the metal atom source is a sputter target 440 in the form of a ring of metal positioned substantially in the plane of substrate 421, so that the front of the sputter target 440 faces away from the substrate 421. The sputter target has no direct line of sight or magnetic field connection to the substrate. No metal evaporator is used.

In order to generate a plasma in this embodiment, the chamber is initially filled with an inert gas, such as Argon, through port 415. Bias voltages are applied to both target 440 and substrate 421. The DC bias voltage is applied to sputter target 440 through a separate lead (not shown) within a separate support tube (not shown). The voltage applied to lead 442 is varied independently of the voltage applied to substrate 421. When the applied potential on target 440 reaches the ionization energy of the gas, electrons from the gas atoms are released. The free ions from this plasma are accelerated towards the target, overcoming the binding energy of the target metal. Metal atoms are sputtered into the plasma column 432. The ionization of the target metal may become self sustaining, so that the Argon is no longer needed to support the plasma in a steady state condition.

As sputter target 440 is struck by the plasma, secondary electrons 444 are emitted from target 440 and move away from the target. Because sputter target 440 is in the plane of substrate 421, there is no direct line of sight or magnetic field connection between the co-planer surfaces of the ring 440 and substrate 421. Thus, secondary electrons from target 440 will not directly impinge onto the substrate 421, and substrate heating by electrons is avoided. Only the material sputtered from the target which is ionized by free electrons in the plasma 432 is deposited on the substrate. Ions of the target metal are thus directed towards the substrate 421 (from the plasma) with a large velocity component parallel to the magnetic field B, relative to the velocity component normal to the field.

FIG. 9a shows a fourth exemplary embodiment of the invention adapted for depositing a metal alloy. The apparatus and method for the fourth embodiment are similar to the apparatus and method shown in FIGS. 1 and 2. The description of the first embodiment in FIGS. 1 and 2 is also pertinent for the embodiment of FIG. 9a, for forming a plasma 123 of ions of a first metal from a vapor source 118 with no line of sight to the form of a ring of a second metal (similar to the target 440 in FIG. 8) is positioned substantially in the plane of the substrate 121, so that the front of the sputter target faces the metal vapor plasma 132.

A DC bias voltage is applied to sputter target 140 through a separate lead (not shown) within a separate support tube (not shown). The voltage applied to lead 142 is varied independently of the voltage applied to substrate 121. Metal vapor plasma 132 now includes a mixture of ions of both the first metal from source 118 and the second metal from target 140. No additional gas feed is required for the sputtering.

The magnitude of the bias voltage applied to the sputter target 140 is varied to control the composition of the alloy material deposited on substrate 121. The sputter target 140 voltage is set high enough to remove the incident first metal ions which impinge on the sputter target 140, and to sputter the desired amount of the second metal into the plasma.

As sputter target 140 is struck by the plasma, secondary electrons 144 are emitted from target 140 and move away from the target. Because target 140 is in the plane of substrate 121, there is no direct line of sight or magnetic field connection between the co-planer surfaces of the ring and the substrate. Thus, secondary electrons from the target 140 will not directly impinge onto the substrate, and substrate heating by electrons is avoided. Only the material sputtered from the target which is ionized by free electrons in the plasma 132 is deposited on the substrate. Ions of the second metal are thus directed towards the substrate 121 (from the plasma) with a large velocity component parallel to the magnetic field B, relative to the velocity component normal to the field.

In addition to the use of a second metal, sputter target 140 may itself include alloy materials, thus increasing the range of films which can be deposited on the substrate 121.

Using evaporator 116 and a sputter target 140 in one assembly, as shown in FIG. 9a, is a simple way to form a plasma having ions of multiple constituent metals without duplicating the expense of the metal evaporator 116, particularly when the desired composition includes only a small concentration of the second metal.

Figure 9B:
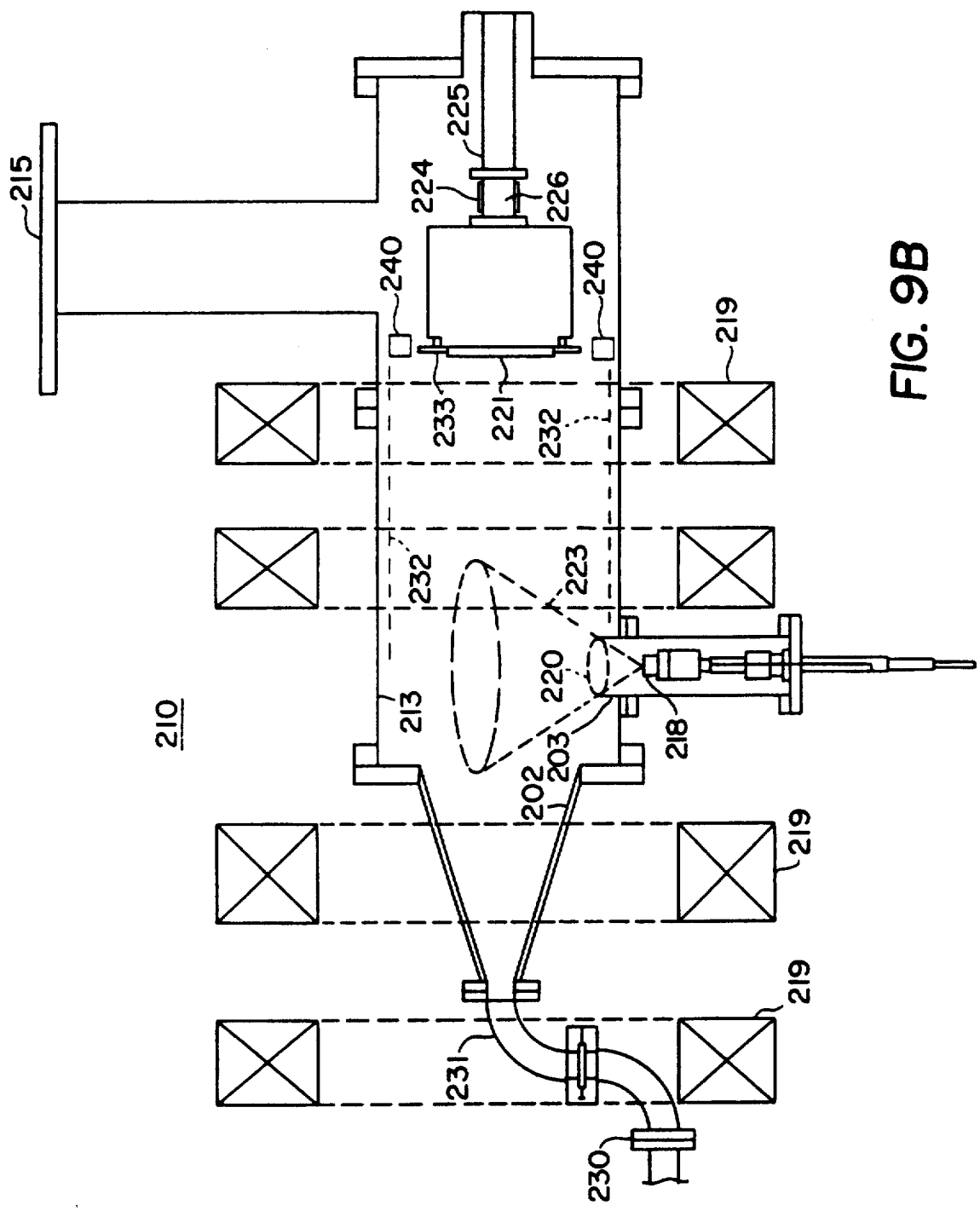

FIG. 9b shows a variation of the embodiment shown in FIG. 9a which includes the basic apparatus of the second embodiment shown in FIGS. 5 and 6, in which a housing 203 for the vapor source 218 is mounted to the chamber 213. The housing 203 has walls which extend into the chamber 213 sufficiently to maintain that the metal atom vapor source 218 has no line of sight to the substrate 221. A biased sputter target 240 is located substantially in the plane the substrate 221, to add ions of a second metal to the plasma. The target 240 bias voltage is varied to control the composition of the plasma 232 and the material deposited on substrate 221.

Figure 10:
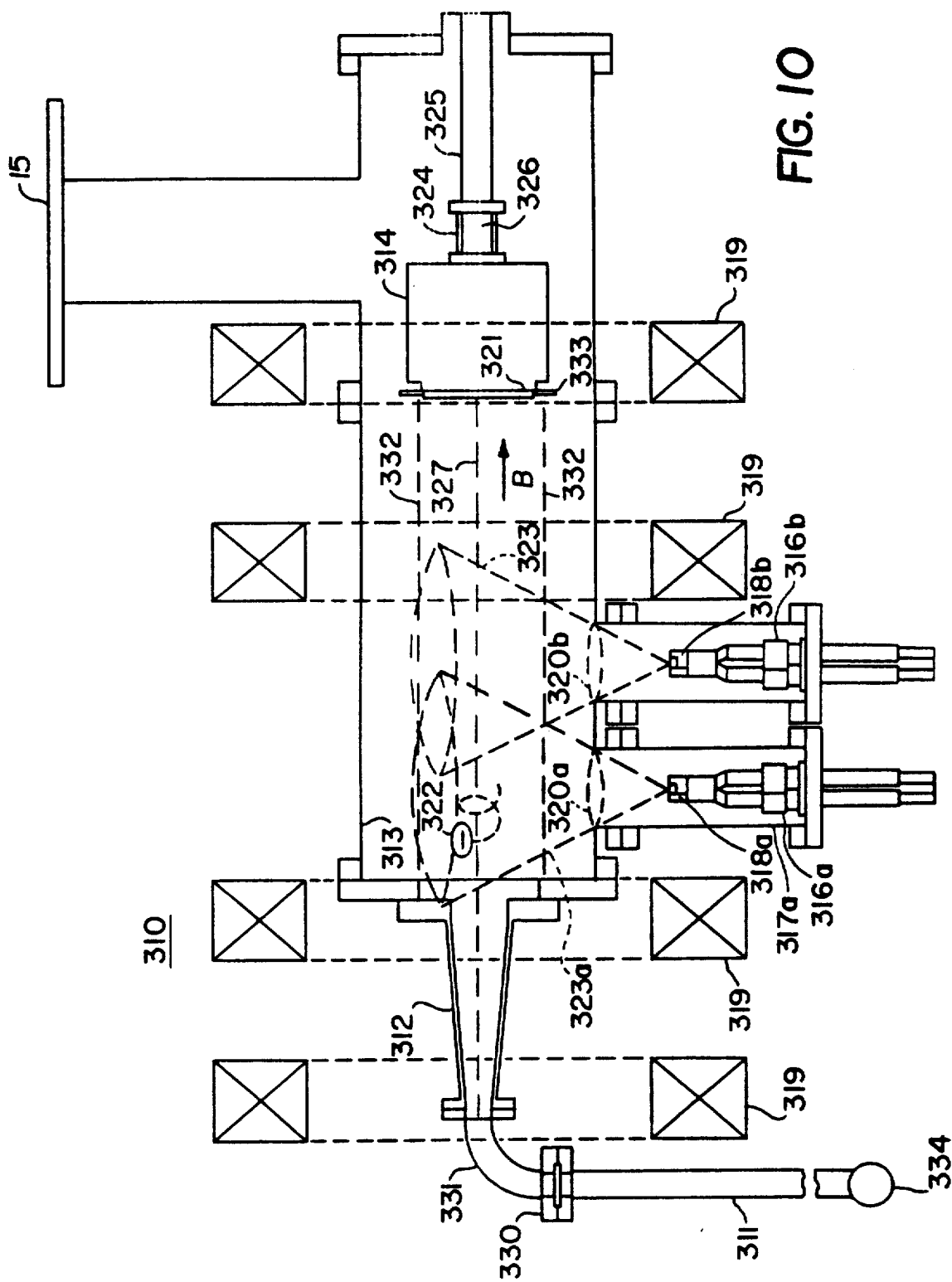
FIG. 10 shows a fifth embodiment of the invention.

FIG. 10 shows a fifth embodiment of the invention in which two distinct evaporators 316a, 316b and metal vapor sources 318a, 318b provide two respective types of metal to the plasma 332. The two vapor sources 318a, 318b are located in close proximity to one another, and are similar to the vapor source 18 shown in FIG. 1 in that there is no line of sight between either vapor source and the substrate 321. A plasma 332 is formed by ionizing atoms from both vapor sources 318a and 318b. The composition of the material deposited on the substrate 321 is controlled by varying the vaporization rate of each metal vapor source 318a, 318b. This embodiment of the invention does require additional hardware relative to the fourth embodiment shown in FIGS. 9a and 9b, but it may be advantageous if a large concentration of the second metal is desired (e.g., 30–50 percent). Large concentrations of a second metal would be more difficult to achieve with the sputtering technique shown in FIG. 9.

It is understood by one skilled in the art that many variations of the embodiments described herein are contemplated. Although the invention has been described for use with high aspect ratio holes, it may also be used to plate holes or passages of normal aspect ratio as desired, eliminating the need for redundant equipments. The improved process and apparatus of this invention can be used to deposit other metal ions such as aluminum ions, silver ions, and the like, but cost and performance considerations must be evaluated in deciding to use these materials.

Further, while the method and apparatus have been described broadly with respect to the filling of holes in semiconductor substrates, the invention is also employed as one step in the general context of microelectronic integrated circuit fabrication. For example, the integrated circuit on the substrate is fabricated by known processes to the point at which it is necessary to fill the holes in the substrate with metal. The next improved step in the process of fabrication is the application of the metal into the holes according to the method steps described herein. Following those steps, the integrated circuit may be further processed by known post-plating procedures, known in the integrated circuit art, the details of which need not be described in the specification.

What is claimed:

1. A method of filling previously formed passages in a semiconductor substrate using a metal plating apparatus of the electron cyclotron resonance plasma heating type, comprising the steps of:

(a) evacuating the chamber;
    (b) transmitting metal atoms into the evacuated chamber from a metal vapor source which has no line of sight to the substrate, such that no matter is added to the evacuated chamber except the metal atoms;
    (c) generating a magnetic field having magnetic field lines that are symmetric relative to an axis of the chamber;
    (d) transmitting microwave energy through the chamber in an axial direction parallel to the axis, generating energetic electronic which spiral around the magnetic field lines;
    (e) ionizing the metal atoms to form metal ions by the energetic electrons, thereby forming a plasma; and
    (f) directing the plasma through the chamber, towards the substrate.

2. A method in accordance with claim 1, wherein said metal atoms transmitted by said metal vapor source are atoms of a first metal, further comprising the step of adding atoms of a second metal into the plasma, thereby ionizing said second metal atoms so that the plasma includes first and second metal ions.

3. A method in accordance with claim 2, in which the step of adding atoms of a second metal includes the steps of:

applying a bias voltage to a sputter target within the chamber; and
    varying said bias voltage to control the composition of said plasma.

4. A method in accordance with claim 3, including the further step of maintaining said bias voltage at or above a minimum value at which ions of said first metal which impinge on said sputter target are removed.

5. A method in accordance with claim 2, further comprising the steps of:

setting the magnetic field intensity higher than its electron cyclotron resonance value at an end of the chamber opposite the substrate; and setting the magnetic field intensity at the electron resonance value near the substrate.

6. A method in accordance with claim 2, wherein the step of adding atoms of a second metal includes transmitting said atoms from a second metal vapor source.

7. A method in accordance with claim 2, in which step (b) includes sputtering atoms from a sputter target that is coplanar with the substrate.

8. The method of claim 1 in which step (f) includes substantially confining the metal ions to the plasma and substantially avoiding contact of said metal ions with the wall of the chamber.

9. The method of claim 1 in which the step of transmitting microwave energy further comprises distributing microwave energy symmetrically about the axis.

10. The method of claim 1, further comprising the steps of:
   setting the magnetic field intensity higher than its electron cyclotron resonance value at an end of the chamber opposite the substrate; and
   setting the magnetic field intensity at the electron resonance value near the substrate.

11. A method in accordance with claim 1, wherein step (f) includes:
   (g) applying a first bias voltage to the substrate to direct the plasma towards the substrate, the bias voltage controlling a plasma energy level to fill a bottom portion of the passage and to partially re-sputter metal that is deposited at a top portion of the passage, thereby preventing the top portion from closing; and
   (h) applying a second bias voltage lower than the first bias voltage to the substrate after step (g) to direct the plasma towards the substrate, to fill the top portion of the passage not filled in step (g).

12. A metal plating system of the electron cyclotron resonance plasma heating type for filling previously formed passages in a semiconductor substrate comprising:
   an evacuated chamber having a longitudinal axis;
   metal vapor source means for transmitting metal atoms into the evacuated chamber, in which the metal vapor source means has no direct line of sight to the substrate such that no matter is added to the evacuated chamber except the metal atoms;
   means for establishing a magnetic field having field lines that are symmetric relative to the chamber axis;
   means for transmitting microwave energy in an axial direction parallel to the axis to generate energetic electrons which spiral around the magnetic field lines whereby the metal atoms are ionized in said chamber by the energized electrons forming a plasma; and
   means for directing the plasma in the axial direction towards the substrate.

13. The system of claim 12, further comprising:
   a housing for the metal vapor source means mounted to the chamber, said housing having walls which extend into the chamber sufficiently to maintain that the metal atom vapor source has no line of sight to the substrate.

14. The system set forth in claim 12, further comprising:
   a housing for the metal atom source means, mounted to the chamber, said housing having walls and a port into the chamber through which the metal atoms are transported in which the port subtends an angle about said atom source means, and the semiconductor substrate is disposed outside of said angle.

15. A system in accordance with claim 12, wherein said metal vapor source transmits atoms of a first metal, further comprising means for transmitting atoms of a second metal into the plasma, whereby said second metal atoms are ionized and said plasma includes first and second metal ions.

16. A system in accordance with claim 15, in which said atom transmitting means include a sputter target positioned substantially in the plane of the substrate, wherein the atoms of the first metal sputter the second metal atoms from the sputter target without introducing any matter into the evacuated chamber except the first metal atoms and the second metal atoms.

17. A system in accordance with claim 15, in which said second metal is an alloy.

18. A system in accordance with claim 15, further comprising:
   a housing for the metal vapor source means mounted to the chamber, said housing having walls which extend into the chamber sufficiently to maintain that the metal vapor source has no line of sight to the substrate.

19. A system in accordance with claim 15, in which the atom transmitting means include further metal vapor source means for transmitting said second metal atoms into the chamber in the form of a vapor, wherein the further vapor source means have no direct line of sight to the substrate.

20. The system of claim 12 in which the means for transmitting microwave energy distributes the microwave energy symmetrically about the axis.

21. The system of claim 12 in which the magnetic field establishing means includes (1) means for setting the magnetic field intensity higher than required to induce electron resonance at an end of the chamber opposite the substrate and (2) means for setting the magnetic field intensity at electron resonance near the substrate.

22. A method of filling a previously formed high aspect ratio passage in a semiconductor substrate using a metal plating apparatus of the electron cyclotron resonance plasma heating type, including an evacuated chamber having an axis, the method comprising the steps of:
   (a) transmitting metal atoms into the chamber from a metal atom source which has no line of sight to the substrate, such that no matter is added to the evacuated chamber except the metal atoms;
   (b) generating a magnetic field having magnetic field lines that are symmetric relative to the axis;
   (c) transmitting microwave energy through the chamber in an axial direction parallel tot he axis, generating energetic electrons which spiral around the magnetic field lines;
   (d) ionizing the metal atoms by the energized electrons, thereby forming a plasma;
   (e) applying a first bias voltage to the substrate directing the plasma towards the substrate, the bias voltage controlling a plasma energy level to fill a bottom portion of the passage and to partially resputter metal deposited in a top portion of the passage, thereby preventing the passage from closing; and
   (f) applying a second bias voltage different from the first bias voltage to the substrate after step (e) directing the plasma towards the substrate, to fill the top portion of the passage not filled in step (e).

23. A method in accordance with claim 22, wherein the first bias voltage has a higher magnitude than the second bias voltage.

24. A method in accordance with claim 22, wherein step (f) includes filling a low aspect ratio feature in the substrate with metal.

* * * * *